United States Patent [19]

Okino

[11] Patent Number: 4,958,233

[45] Date of Patent: Sep. 18, 1990

[54] DIGITAL AND ANALOG IMAGE RECORDING APPARATUS

[75] Inventor: Yoshiharu Okino, Kanagawa, Japan

[73] Assignee: Fuji Photo Film Col, Ltd., Kanagawa, Japan

[21] Appl. No.: 181,953

[22] Filed: Apr. 15, 1988

[30] Foreign Application Priority Data

Apr. 15, 1987 [JP] Japan .................................. 62-90646

[51] Int. Cl.$^5$ ........................ G01D 15/14; H04N 1/21; G03B 41/00
[52] U.S. Cl. .................................. 358/302; 346/108; 354/4; 430/138
[58] Field of Search ...................... 346/108, 160, 76 L; 358/296, 300, 302, 75; 354/4, 5, ; 430/138

[56] References Cited

U.S. PATENT DOCUMENTS

| | | | |
|---|---|---|---|
| 3,351,948 | 11/1967 | Bonn | 346/76 L |
| 4,632,538 | 12/1986 | Lemelson | 358/300 |
| 4,728,965 | 3/1988 | Kesskr | 346/108 |

Primary Examiner—Mark J. Reinhart
Attorney, Agent, or Firm—Sughrue, Mion, Zinn, Macpeak & Seas

[57] ABSTRACT

A multi-mode image recording apparatus which can record on a common photo-sensitive sheet either an analog color image produced by reflecting white light off an original or a digital color image produced by modulating one or more infrared lasers according to an electrical signal. The photo-sensitive sheet is sensitive to three bands of visible radiation and to at least one band of infrared and is developed by pressure to three visible colors.

8 Claims, 3 Drawing Sheets

DIGITAL AND ANALOG IMAGE RECORDING APPARATUS

BACKGROUND OF THE INVENTION

1. Field Of The Invention

This invention relates to an image recording apparatus in which pressure is applied to a photosensitive material to fix a latent image in the photosensitive material so as to develop it as a visible image. The photosensitive material is made up of a support and an active material on the support.

2. Background Of the Invention

One example of an image recording material using microcapsules containing photosensitive compounds has been disclosed, for instance, in Japanese Patent Application (OPI) No. 179836/1982 (the term "OPI" as used herein means an "unexamined published application"). The image recording material is made up of a support and a layer of synthetic macromolecular resin wall capsules containing a vinyl compound a photopolymerization starter and a coloring agent precursor which is formed on the support. To record an image employing the image recording material, an image is optically exposed on the image recording material so that the microcapsules are hardened according to the light distribution of the image. Then the image recording material is subjected to pressure so that the microcapsules not yet hardened are broken to release the coloring agent precursor and to thereby obtain a colored image. The method is advantageous in that images of high picture quality can be obtained by a simple dry process. However, it is still disadvantageous in that the image recording material has a much lower photosensitivity than a recording material using silver halogenide.

A novel image recording material which is free from the above-described difficulty and which shows high photosensitivity and which can provide images of high quality by simple dry process has been disclosed in Japanese Patent Application (OPI) No. 275742/1986, filed by the present inventor. The image recording material is a photosensitive pressure-sensitive thermal developing material It is formed by coating a support at least with photosensitive silver halogenide, reducing agent, polymerizing compound and color image forming material. At least the polymerizing compound and color image forming material are together contained in microcapsules.

An image recording method utilizing the above-described photosensitive pressure-sensitive thermal developing material has been disclosed in Japanese Patent Application (OPI) No. 278849/1986, filed by the present inventor. In this method, first a latent image is formed on the image recording material by optical exposure. Then, the image recording material is heated so that, in the region where the latent image has been formed, the polymerizing compound is polymerized to produce macromolecular compound to thereby harden the microcapsules. Thereafter, the thus treated image recording material is piled on an image receiving material having an image receiving layer onto which the color image forming material can be transferred. Under this condition, pressure is applied to the image recording material and the image receiving material so that, in the region where no latent image has been formed the microcapsules are substantially broken, which causes the color image forming material to transfer onto the image receiving material to thereby obtain the image on the image receiving material.

An image recording apparatus which automatically performs the steps of forming by optical exposure a latent image on the above-described photosensitive material, of thermally developing it, of piling the photosensitive material on the image receiving material, and of pressing together the photosensitive material and the image receiving material to obtain the image has been disclosed in Japanese Patent Application No. 51896/1986 filed by the present inventor.

On the other hand, Japanese Patent Application Nos. 42747/1986 and 208786/1986, filed by the present inventor have disclosed a photosensitive material which is sensitive to visible light and infrared radiation. The microcapsules themselves, which are contained in the photosensitive material, are sensitive both to visible light and to infrared radiation. Therefore, with this photosensitive material, optical exposure either with visible light alone or with both visible light and infrared radiation in combination can record full-color images.

One example of an apparatus for optically exposing the photosensitive material with visible light is an analog copying device in which the photosensitive material is optically exposed with light reflected from an original which is illuminated by white light. One example of an apparatus which uses infrared radiation for exposure of the photosensitive material is a digital laser printer in which image data are converted into electrical signals to control a light beam outputted by an infrared light source to thereby expose the photosensitive material. Therefore, one of the two apparatuses should be chosen for use according to the object of the image recording operation. Thus, there has been a strong demand for an image recording apparatus which can perform both the analog exposure and the digital exposure.

SUMMARY OF THE INVENTION

Accordingly, an object of this invention is to provide an image recording apparatus which comprises an analog exposure unit and a digital exposure unit so that at least one of the exposure units is operated to record an image on a photosensitive material which is sensitive both to visible light and to infrared radiation.

The foregoing object and other objects of the invention have been achieved by an image recording apparatus in which a photosensitive material made up of a support and a material carried on the support which, when pressurized, fixes an image formed therein. The photosensitive material is sensitive to at least three wavelengths of visible light and at least one wavelength of infrared radiation. Pressure is applied to the photosensitive material so that image data provided on the photosensitive material are developed according to three colors, cyan, magenta and yellow. According to the invention, the recording apparatus comprises a reflection type analog exposure unit for optically exposing the photosensitive material with light reflected from an original which is illuminated by visible light and a digital exposure unit for optically exposing the photosensitive material with a light source which emits at least one wavelength of infrared radiation.

In the image recording apparatus of the invention, the photosensitive material is sensitive both to visible light and to infrared radiation. In copying an original, the analog exposure is carried out only with visible light. In recording image data converted into electrical signals, the digital exposure is performed by using in combination at least one wavelength of infrared radiation and visible light. Thus, two kinds of image recording operations can be achieved by using one kind of photosensitive material.

In the invention, the photosensitive material employed is sensitive, for instance, to red light, green light and blue light and to two infrared wavelengths. Examples of the photosensitive material of this type have been disclosed in the above-described Japanese Patent Application Nos. 42747/1986 and 208786/1986. The analog exposure for copying an original is carried out by using white light. The digital exposure for recording image data converted into electrical signals is performed by using red light and two wavelengths of infrared radiation emitted from LEDs (light emitting diodes) or semiconductor lasers which are small in size and can be readily controlled. The microcapsules on the photosensitive material's support are sensitive to the above-described five wavelengths of light. The color image forming material is so prepared that, for instance, the microcapsules which are sensitive to blue light and to the first infrared wavelength produce a yellow color, the microcapsules which are sensitive to green light and to the second infrared wavelength produce a magenta color, and the microcapsules which are sensitive to red light produce a cyan color. Therefore, the image recording apparatus of the invention can record full-color images both by analog exposure and by digital exposure.

The nature, principle and utility of the invention will become more apparent from the following detailed description when read in conjunction with the accompanying drawings.

DETAILED DESCRIPTION OF THE PREFERRED EMBODIMENTS

One preferred embodiment of this invention will be described with reference to the accompanying drawings.

Figure 1:
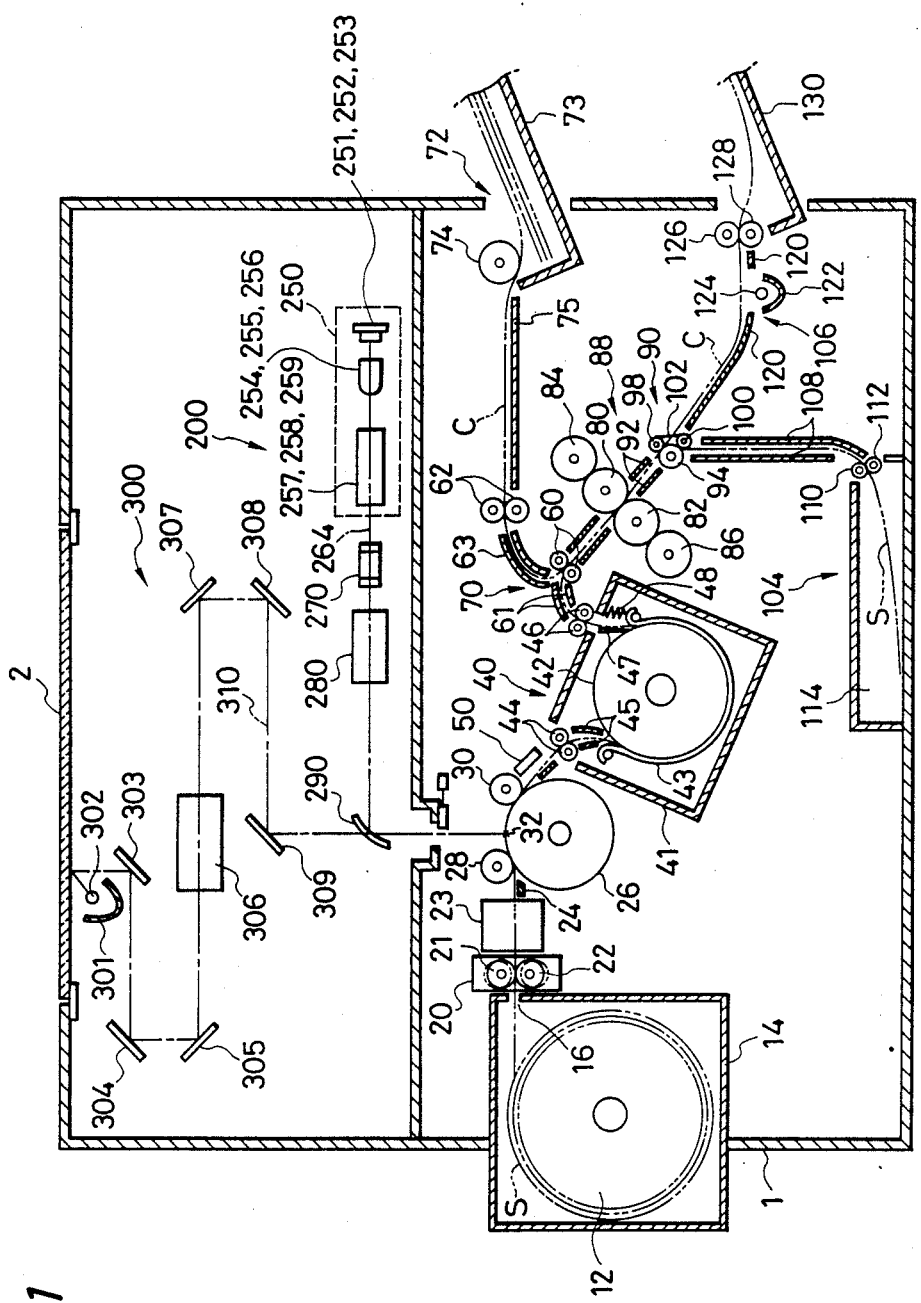
FIG. 1 is a sectional view showing the arrangement of one example of an image recording apparatus according to this invention.

An image recording apparatus according to the invention, as shown in FIG. 1, has a housing 1 the top of which is made up of a glass plate 2 for supporting an original to be recorded. A conventional analog exposure unit 300 of the type in which the image-forming-lens moves is provided below the glass plate 2. The analog exposure unit 300 includes an illuminating lamp 302 with a reflecting mirror 301 which linearly scans the lower surface of the glass plate 2. Mirrors 303, 304 and 305 carry the reflected light along a path 310 to an assembly 306 of an image forming lens and a filter unit. Mirrors 307 and 308 move half (½) of the scanning distance of the illuminating lamp 302 and in the same direction and carry the light along the optical path 310 to a stationary mirror 309.

The image recording apparatus further includes within the housing 1 a digital exposure unit 200. The digital unit 200 includes a light source 250 made up of three semiconductor lasers 251, 252 and 253, collimator lenses 254, 255 and 256 and cylindrical lenses 257, 258 and 259. A rotating polygonal mirror 270 receives the light from the digital unit 250 along a path 264 and scans the light through an fθ lens 280 to a cylindrical mirror 290. The cylindrical mirror 290 is positioned at the intersection of the optical path 310 of the analog exposure unit 300 and the optical path 264 of the digital exposure unit 200. The cylindrical mirror 290 is retracted by an unillustrated drive mechanism from the analog optical path 310 when the analog exposure unit 300 is in operation.

A photosensitive material magazine 14, in which a photosensitive material roll 12 formed by winding a photosensitive material S is loaded is detachably mounted on one side of the housing 1. The magazine 14 has an outlet 16 through which the photosensitive material S is pulled out. A pair of photosensitive material supply rollers 21 and 22 are mounted in a dark box 20 connected to the magazine 14 at a position next to its outlet 16 so that a predetermined length of the photosensitive material S is supplied from the magazine 14 at a predetermined time instant, or is retracted into the magazine 14 when necessary.

As the front end of the photosensitive material S approaches the supply rollers 21 and 22, the supply rollers 21 and 22 are moved away from each other as indicated by the phantom lines so that the photosensitive material S may pass therebetween with ease. A cutter unit 23, for cutting the photosensitive material S, and a guide board 24 are arranged in front of the dark box 20. The term "in front of" as used herein is intended to mean "downstream" as viewed in the direction of movement of the photosensitive material or of an image receiving sheet (described later).

A sheet support roller 26 and two sheet nip rollers 28 and 30 are arranged in front of the guide board 24 in such a manner that the nip rollers 28 and 30 are pushed against the support roller 26. The photosensitive material S, being guided by the guide board 24, is brought into close contact with the support roller 26 by means of the nip rollers 28 and 30, and is optically exposed at a position 32 between the nip rollers 28 and 30 by either the analog exposure unit 300 or the digital exposure unit 200 so that a latent image is formed on the photosensitive material.

In front of the sheet support roller 26, there is provided a thermal developing unit 40 for subjecting the photosensitive material S to thermal developing. The developing unit 40 comprises a heat insulating developer housing 41, a conveying drum 42 arranged in the developer housing 41 to convey the photosensitive material S while supporting it, and a curved heating board 43 covering the cylindrical wall of the conveying drum 42 over about 240°. The heating board 43 is pushed against the conveying drum 42 by means of a spring 48. The thermal developing is carried out while the photosensitive material S is being conveyed and being supported between the conveying drum 42 and the heating board 43. The developing unit 40 further includes a pair or conveying rollers 44 and guides 45 which are adapted to guide the photosensitive material S to the conveying drum 42. A separating pawl 47 separates the photosensitive material S from the conveying drum 42 and guides it to the nipping region of another pair of conveying rollers 46.

In front of the second set of conveying rollers 46, there is located a photosensitive material and image receiving sheet piling unit 70. The piling unit 70 includes a pair of pressing rollers 60 and guides 61 for guiding the photosensitive material S from the conveying rollers 46 to the nipping region of the pressing rollers 60. Another set of guides 63 guide an image receiving sheet C to the nipping region of the pressing rollers 60. This image receiving sheet C is supplied from an image-receiving-sheet supply unit 72 and is conveyed by a conveying roller 62.

The image-receiving-sheet supply unit 72 is partially mounted outside of the housing 1. The supply unit 72 includes an image-receiving-sheet cassette 73 holding a number of stacked image receiving sheets C. A supply roller 74 supplies the image receiving sheets C from the cassette 73 one by one beginning with the top. The image receiving sheets are guided by a guide 75.

An image transfer unit 88 is provided in front of the piling section 70. The transfer unit 88 comprises a pair of pressurizing nip rollers 80 and 82 and backup rollers 84 and 86 for making the pressure of the nip rollers 80 and 82 uniform in the axial direction. The nip rollers 80 and 82 are pushed against each other under a pressure of about 500 kg/cm$^2$.

A photosensitive material and image-receiving sheet separating unit 90 is provided in front of the transfer unit 80. The separating unit 90 comprises guides 92, a conveying roller 94, and two endless separating belts 102 laid over guide rollers 98 and 100 in such a manner that the belts 102 are pushed against the photosensitive material S but not the image-receiving sheet C at both ends of the conveying roller 94.

The separating unit 90 is followed by a photosensitive material disposal section 104 in one direction and by an image fixing unit 106 in the other direction. The disposal section 104 comprises guides 108, a pair of conveying rollers 110 and 112, and a disposal box 114. In the disposal section 104, the photosensitive material S conveyed from the separating unit 90 and guided by the guides 108 is delivered into the disposal box 114 by means of the conveying rollers 110 and 112.

The image fixing unit 106 comprises a guide 120, an ultraviolet lamp 124 with a reflector 122, and a pair of conveying rollers 126 and 128. In the image fixing unit 106, ultraviolet light is irradiated on the image receiving sheet C for about 5 seconds as it is being conveyed from the separating unit 90 and is guided by the guides 120 so that the image is fixed.

In front of the image fixing unit 106, a take-out tray 130 for receiving the image receiving sheet C is provided in such a manner that it protrudes from the housing 1.

Figure 2:
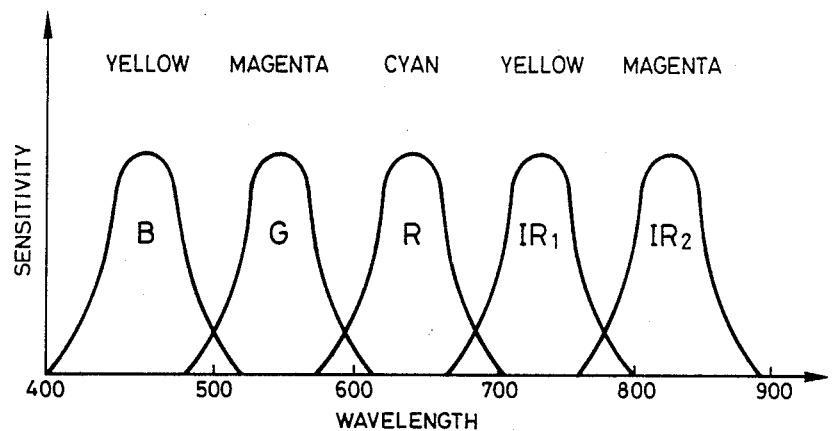
FIG. 2 is a graphical representation indicating the sensitivity of a photosensitive material used in the apparatus.

FIG. 2 is a graphical representation indicating the sensitivity of the photosensitive material S used in the invention. The photosensitive material S is sensitive to visible light namely, red light, green light and blue light, and to two infrared bands which are at about 750 nm and 830 nm in wavelength. Microcapsules which are sensitive to the red light contain a color forming material which colors cyan. Microcapsules which are sensitive to the green light and to the infrared radiation at about 830 nm in wavelength contain a color forming material which colors magenta. Microcapsules which are sensitive to the blue light and to the infrared radiation at about 750 nm in wavelength contain a color forming material which colors yellow. Therefore the exposure with the red, green and blue light from the analog exposure unit 300 and the exposure with the infrared radiation at about 750 nm and 830 nm from the digital exposure unit 200 can both form full-color images.

Figure 3:
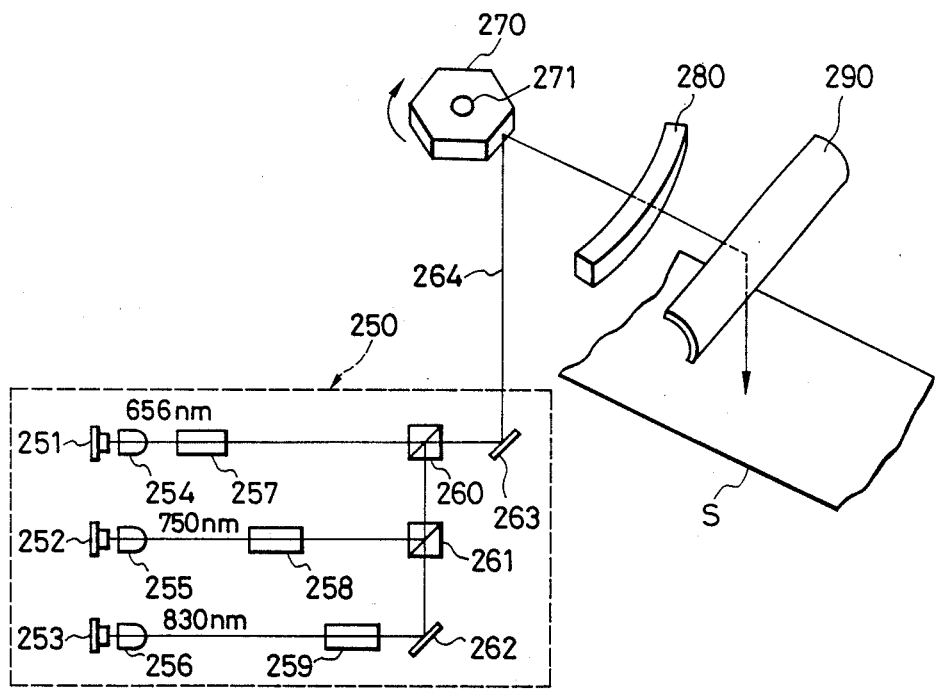
FIG. 3 is an explanatory diagram for a description of a digital exposure unit in the apparatus.

FIG. 3 is an explanatory diagram outlining the arrangement of the digital exposure unit 200. An image light beam from the digital light source 250 advances along an optical path 264 to the rotating polygon mirror 270, where it is reflected. The light beam thus reflected is applied through the f$\theta$ lens 280 to the cylindrical mirror 290, where it is reflected, thus reaching the photosensitive material S. As the polygon mirror 270 is rotated around the axis 271, the image light beam is caused to scan the photosensitive material S. Three different light beams corresponding to blue, green and red, are outputted by the digital light source 250, forming a combined beam and following one and the same optical path 264.

The digital light source 250 has three semiconductor lasers 251, 252 and 253. Different electrical signals, representing the cyan, magenta and yellow components of a single scanned color image, are simultaneously fed to the lasers 251, 252 and 253 to modulate their intensities. The semiconductor laser 251 produces a red beam and is used to cause the photosensitive material to color cyan. It outputs a light beam having a wavelength of 656 nm and it may be an InGaAlP semiconductor laser described in the publication "The 47the Applied Physics Society Academic Lecture Preparatory Papers" pp 164 et. seq., 28a-T-5. The second semiconductor laser 252 produces an infrared beam and is used to cause the photosensitive material to color yellow. It outputs a light beam having a wavelength of 750 nm and it may be a semiconductor laser "LT030" manufactured by Sharp Co. Ltd. The third semiconductor laser 253 is used to cause the photosensitive material to color magenta and it outputs a light beam having a wavelength of 830 nm. It may be a semiconductor laser "HL8311" manufactured by Hitachi Seisakusho Co. Ltd.

The light beam of 656 nm in wavelength outputted by the first semiconductor laser 251 is shaped by the collimating lens 254 and is applied through the cylindrical lens 257 to a first prism 260. The light beam of 750 nm in wavelength outputted by the second semiconductor laser 252 is shaped by the collimating lens 255 and is applied through the cylindrical lens 258 to a second prism 261. The light beam of 830 nm in wavelength outputted by the third semiconductor laser 253 is shaped by the collimating lens 256 and is applied through the cylindrical lens 259 to a reflecting mirror 262, where it is reflected towards the second prism 261.

The second prism 261 is so designed as to transmit the 830 nm light beam and reflect the 750 nm light beam. Therefore, the light beam outputted by the third semiconductor laser 253, after being reflected by the reflecting mirror 262, is passed through the second prism 261, thus reaching the first prism 260. However, the light beam outputted by the second semiconductor laser 252 is reflected by the second prism 261 towards the first prism 260.

The first prism 260 is so designed as to transmit the light beam 656 nm in wavelength, and reflect the light beams ranging in wavelength from 750 nm to 830 nm. Therefore, the light beam outputted by the first semiconductor laser 251 is passed through the first prism 260, while the light beams outputted by the second and third semiconductor lasers 252 and 253 are reflected towards the mirror 263.

Accordingly, the 656 nm light beam outputted by the first semiconductor laser 251, the 750 nm light beam outputted by the second semiconductor laser 252, and the 830 nm light beam outputted by the third semiconductor laser 253, advancing along one and the same optical path 264, reach the mirror 263 in coincidence, where they are reflected towards the polygonal mirror 270. These light beams thus reflected are further reflected by the rotating polygonal mirror 270 so that they are applied through the fθ lens 280 and the cylindrical mirror 290 to scan the photosensitive material S. As was described above, the photosensitive material S is a photosensitive pressure-sensitive material which is sensitive to red light and to infrared light beams of about 750 nm and about 830 nm in wavelength. The photosensitive material S is moved in a direction perpendicular to the laser beam scanning direction. The fθ lens 280 is so corrected that no chromatic aberration occurs with light beams ranging from 630 nm to 850 nm in wavelength.

The second prism 261 transmits or reflects light depending on its wavelength. However, it may be replaced by one which transmits or reflects light depending on its polarization direction. For instance, in the case where the second prism 261 is transparent for the polarization direction of the light beams outputted by the second and third semiconductor lasers 252 and 253 and reflective for the other polarization direction, the light beam outputted by the second semiconductor laser 252, after passing through the cylindrical lens 258, is changed, for instance, by 90° in the angle of polarization by a half-wave plate and then reflected by the second prism 261.

In the case where the semiconductor lasers 251, 252 and 253 have different angles of spread, slits are disposed between the collimating lenses 254, 255 and 256 and the cylindrical lenses 258, 258 and 259, respectively, so that the light beams emergent from the semiconductor lasers have the same configuration.

In the above-described image recording apparatus, the cylindrical mirror 290 of the digital exposure unit 200 is caused to go in and out of the optical path 310 of the analog exposure unit 300 so that the exposure units 200 and 300 are operated independently of each other to perform optical exposure at the same position 32 on the support roller 26. However, the apparatus may be so modified that for digital recording the cylindrical mirror 290 is arranged out of the optical path 310 of the analog exposure unit 300 to perform the digital exposure at the same support roller position 32 or at a position different from that which is provided for the analog exposure unit 300. In the latter case, i.e., in the case where the exposure position for the analog exposure unit 300 is different from that for the digital exposure unit 200, the timing of cutting the photo-sensitive material S, that of piling the photo-sensitive material S on the image receiving sheet C, and that of separating the photo-sensitive material S from the image receiving sheet C are determined separately according to the type of exposure unit 200 or 300.

Furthermore, in the case where the exposure position provided for the analog exposure unit 300 is different from that provided for the digital exposure unit 200, as described above, dual exposure can be performed by operating the two exposure units at the same time. That is, it is possible that, while an original is being optically recording with the analog exposure unit 300, image data such as characters or figures converted into electrical signals are optically recorded with the digital exposure unit 200. In this case it is necessary to provide an infrared ray blocking filer in the optical path 310 of the analog exposure unit 300.

In the case where the photo-sensitive material S is sensitive to three bands of infrared radiation, thus coloring cyan, magenta and yellow, respectively, the digital exposure unit 200 is so designed as to emit the three types of infrared radiation. Also, a half-mirror for transmitting red light, green light and blue light and reflecting infrared rays is disposed at the intersection of the optical path 310 of the analog exposure unit 300 and the path 264 of the digital exposure unit 200. In this case, the exposure units 200 and 300 can be operated simultaneously or one at a time to perform optical exposure at the same position.

In the case where the photo-sensitive material S is sensitive to two bands of visible light and one band of infrared ray, thus coloring cyan, magenta and yellow, respectively, the digital exposure unit 200 is so designed that it emits the two bands of visible light and the one band of infrared radiation.

Furthermore, the digital exposure unit may be so modified that the exposure is achieved with three LEDs for emitting the above-described three light beams of different wavelength.

As is apparent from the above description, with the image recording apparatus, the analog exposure is illuminated by white light and the digital exposure for optically recording image data in the form of electrical signals such as character codes, bit maps, binary signals and gradation signals uses at least one kind of infrared ray. Both the analog and digital exposures can be applied to the photo-sensitive material which is sensitive to at least three bands of visible light and at least one band of infrared radiation selected according to the recording object. Furthermore, by simultaneously analog and digitally exposing the photo-sensitive material, two different images can be recorded in a superimposed mode.

What is claimed is:

1. An image recording apparatus, comprising:
a photosensitive material developable into three colors;
an analog exposure unit comprising a source of visible light directed at an original and a first set of optics for directing light reflected from said original to said photosensitive material; and
a digital exposure unit comprising first and second respective light sources, individually modulated by first and second image signals, and respectively emitting modulated first and second beams of infrared radiation in first and second wavelength bands and a second set of optics for combining and directing said first and second beams to said photosensitive material, wherein said photosensitive material is developable into first and second colors in response to application of said first and second wavelength bands of said first and second beams, respectively, and wherein said light reflected from said original and said first beam simultaneously irradiate said photosensitive material.

2. An image recording apparatus as recited in claim 1, wherein said digital exposure unit further comprises a third light source modulated by a third image signal and emitting a modulated third beam of radiation in a third wavelength band and wherein second set of optics includes means for combining said first, second and third beams, wherein said photosensitive material is developable into a third color in response to application of said third wavelength band of said third beam.

3. An image recording apparatus as recited in claim 2, further comprising a movable reflector to alternately direct to said photosensitive material either said light reflected from said original or said combined first, second and third beams.

4. An image recording apparatus as recited in claim 3, wherein said second wavelength band comprises a visible band.

5. An image recording apparatus as recited in claim 1, further comprising means for pressing said photo-sensitive material to thereby develop an image exposed therein by either of said analog and digital exposure units.

6. An image recording apparatus as recited in claim 5, wherein said photo-sensitive material is photo-sensitive to three wavelength bands of visible light to produce corresponding colors of said developed image and is photo-sensitive to said first wavelength band of infrared radiation.

7. An image recording apparatus as recited in claim 6, wherein said three colors of said developable photosensitive material are cyan, magenta and yellow.

8. An image recording apparatus as recited in claim 1, further comprising a movable reflector to alternately direct to said photosensitive material said light reflected from said original or said first beam of infrared radiation.

* * * * *